United States Patent
Chang et al.

(10) Patent No.: US 10,965,293 B1
(45) Date of Patent: Mar. 30, 2021

(54) VOLTAGE CONTROLLED DELAY LINE GAIN CALIBRATION

(71) Applicant: Taiwan Semiconductor Manufacturing Company, Ltd., Hsinchu (TW)

(72) Inventors: Ya-Tin Chang, Hsinchu (TW); Chih-Hsien Chang, New Taipei (TW); Mao-Hsuan Chou, Hsinchu County (TW); Ruey-Bin Sheen, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/810,225

(22) Filed: Mar. 5, 2020

Related U.S. Application Data

(60) Provisional application No. 62/962,373, filed on Jan. 17, 2020.

(51) Int. Cl.
*H03L 7/089* (2006.01)
*H03K 5/134* (2014.01)
*H03L 7/07* (2006.01)

(52) U.S. Cl.
CPC ........... *H03L 7/0891* (2013.01); *H03K 5/134* (2014.07); *H03L 7/07* (2013.01)

(58) Field of Classification Search
CPC ... H03L 7/06; H03L 7/07; H03L 7/083; H03L 7/087; H03L 7/089; H03L 7/0891; H03L 7/0893; H03L 7/0895; H03L 7/0896; H03L 7/0898; H03L 7/091; H03K 5/13; H03K 5/133; H03K 5/134
See application file for complete search history.

(56) References Cited

U.S. PATENT DOCUMENTS

| | | | | |
|---|---|---|---|---|
| 6,642,761 | B1 * | 11/2003 | Tien | G11C 7/22 327/158 |
| 8,841,948 | B1 | 9/2014 | Chien et al. | |
| 2005/0068073 | A1 * | 3/2005 | Shi | H03L 7/0812 327/156 |
| 2007/0216489 | A1 * | 9/2007 | Krishnan | H03L 7/14 331/16 |
| 2011/0102033 | A1 | 5/2011 | Pentakota | |
| 2012/0134403 | A1 | 5/2012 | Kam et al. | |
| 2020/0099371 | A1 | 3/2020 | Chou et al. | |

* cited by examiner

*Primary Examiner* — Diana J. Cheng
(74) *Attorney, Agent, or Firm* — Merchant & Gould P.C.

(57) ABSTRACT

A delay-locked loop includes a phase detector configured to detect a phase difference between a first clock and a second clock, a charge pump configured to increase a charge amount at a capacitive load in accordance with a first charge amount and decrease the charge amount at the capacitive load in accordance with a second charge amount based on a phase difference provided by the phase detector, a sample and hold circuit configured to receive the charge amount from the capacitive load and hold the charge amount, and a voltage control delay line configured to select a delay amount based on the charge amount received from the sample and hold circuit. At least one parameter of the delay-locked loop is configured such that a desired pump current ratio of a delay cell is achieved by adjusting a delay amount of the delay cell and/or an amount of current coupled to the delay cell.

20 Claims, 9 Drawing Sheets

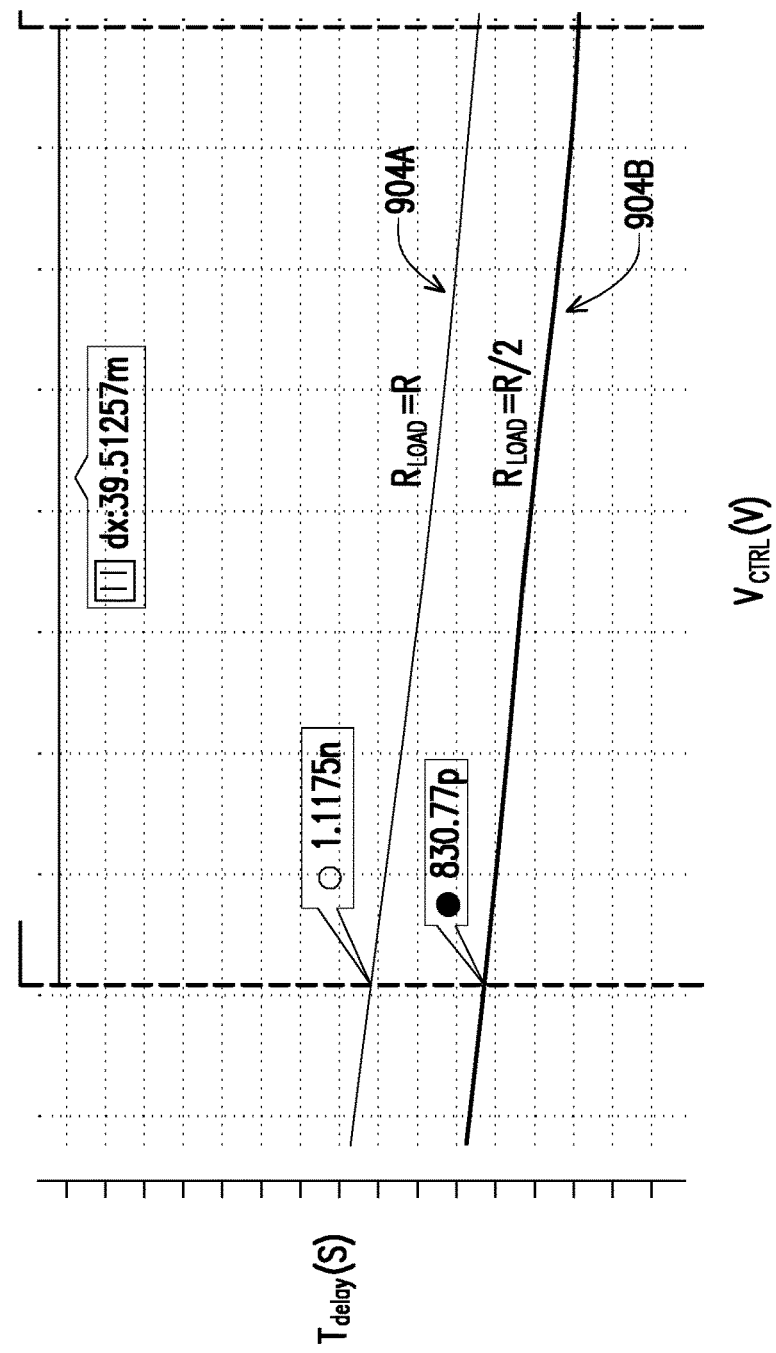
FIG. 9A
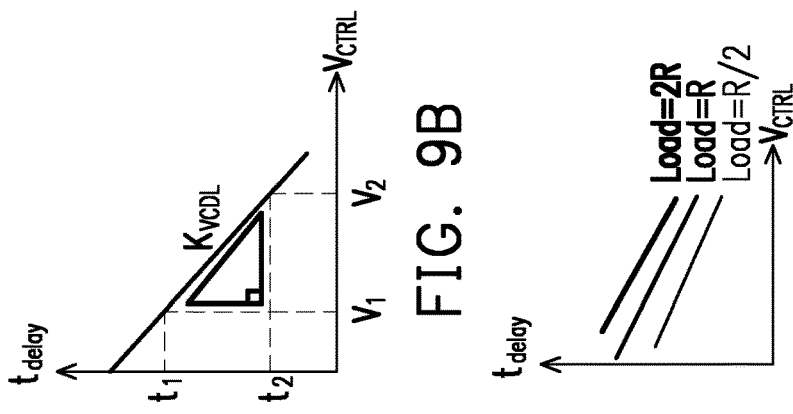
FIG. 9B
FIG. 9C

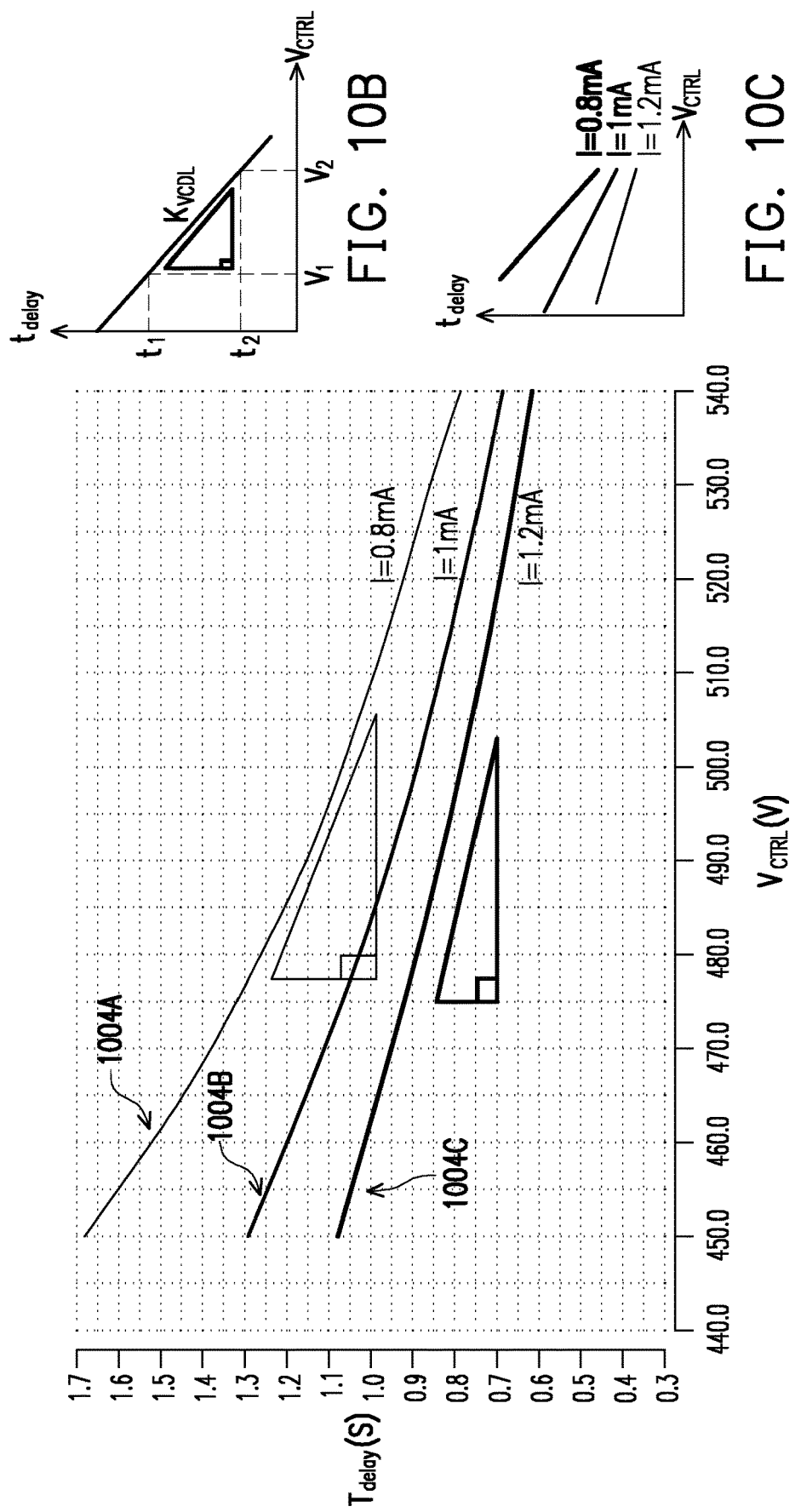

VOLTAGE CONTROLLED DELAY LINE GAIN CALIBRATION

CROSS REFERENCE

This application claims the benefit of U.S. Provisional Patent Application No. 62/962,373, filed on Jan. 17, 2020, the entire contents of which is incorporated by reference.

BACKGROUND

Management of chip-level clock skew is typically handled by careful layout of an integrated circuit (IC) device. Clock skew occurs because the clock must be distributed throughout the system using board traces, connectors, backplanes, and chip-level input-clock driver pads and on-chip interconnect, for example. Several techniques are available, including buffered-tree, clock-grid, and clock-tree synthesis approaches. The buffered tree is routinely used on FPGA devices because the register clock multiplexer input pins create a fixed, regular load. Clock-tree synthesis is popular in ASIC designs because it optimizes performance, power, and area. As faster technologies have become available, it has become necessary to use phase-locked loop (PLL) and delay-locked loop (DLL) circuits to minimize skew. Elements that exhibit significant delay may be put inside of a feedback loop, such that the effective delay can be minimized or nulled.

The delay locked loop (DLL) is a commonly used circuit for synchronizing clocks. The DLL works by inserting delay between an input clock and a feedback clock until the two rising edges align, putting the two clocks 360° out of phase (meaning they are in phase but delayed by exactly one clock cycle time). After the edges from the input clock line up with the edges from the feedback clock, the DLL "locks." As long as the circuit is not evaluated until after the DLL locks, the two clocks have no discernible difference in phase. The traditional delay-locked loop (DLL) includes a phase detector (PD), a charge pump (CP), loop filter (LP), and a voltage control delay line. The PD generally detects a phase skew between an input clock and an output clock. The CP and LP generally translate the phase error between the input clock and the output clock to a voltage domain and utilize the voltage domain to select a delay time via a voltage control delay line (VCDL). The VCDL may adjust a delay time from the input clock to the output clock such that the overall delay time is the same as the period of input clock. When the DLL is locked, the overall VCDL delay time from the input clock to the output clock is equal to the period of the input clock. If a desired phase skew $\Delta\theta$ is to be generated, where $\Delta\theta$ is proportional to the input clock having a ratio M, then the overall delay line stages of the VCDL is equal to M. If the ratio M is to be adjusted, a multiplexer may be utilized to select the M stage output for the desired clock output. However, the added circuit hardware, such as the multiplexer, tends to be complex and often introduces additional delay. Thus, a total delay time from the input clock to the output clock may be equal to $M \times \Delta\theta + T_{dmux}$, where $T_{dmux}$ is equal to the total delay of the multiplexor. However, it is difficult to characterize the delay time of a multiplexer and how such multiplexer affects the phase skew $\Delta\theta$ accuracy.

Moreover, the $\Delta T$ of the voltage controlled delay line occurs at the pico-second level and is difficult to provide accurate measurements. Conventional method utilize a high resolution time domain flash analog to digital converter (ADC) to measure subtle delay time difference. However, if there is a mismatch between one or more VCDLs in this structure, the measurement performance will degrade. Additionally, conventional methods suffer from high power consumption issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9A depicts a second example graph illustrating a coarse tune adjustment process to adjust a load in accordance with examples of the present disclosure.

FIG. 9B depicts a first example relationship between $K_{VCDL}$, $V_{CTRL}$, and $t_{delay}$ in accordance with examples of the present disclosure.

FIG. 9C depicts an example relationship between a Load, $V_{CTRL}$, and $t_{delay}$ in accordance with examples of the present disclosure.

FIG. 10A depicts a second example graph illustrating a fine tune adjustment process to adjust current in accordance with examples of the present disclosure.

FIG. 10B depicts a second example relationship between $K_{VCDL}$, $V_{CTRL}$, and $t_{delay}$ in accordance with examples of the present disclosure.

FIG. 10C depicts an example relationship between current, $V_{CTRL}$, and $t_{delay}$ in accordance with examples of the present disclosure.

DETAILED DESCRIPTION

Figure 1:
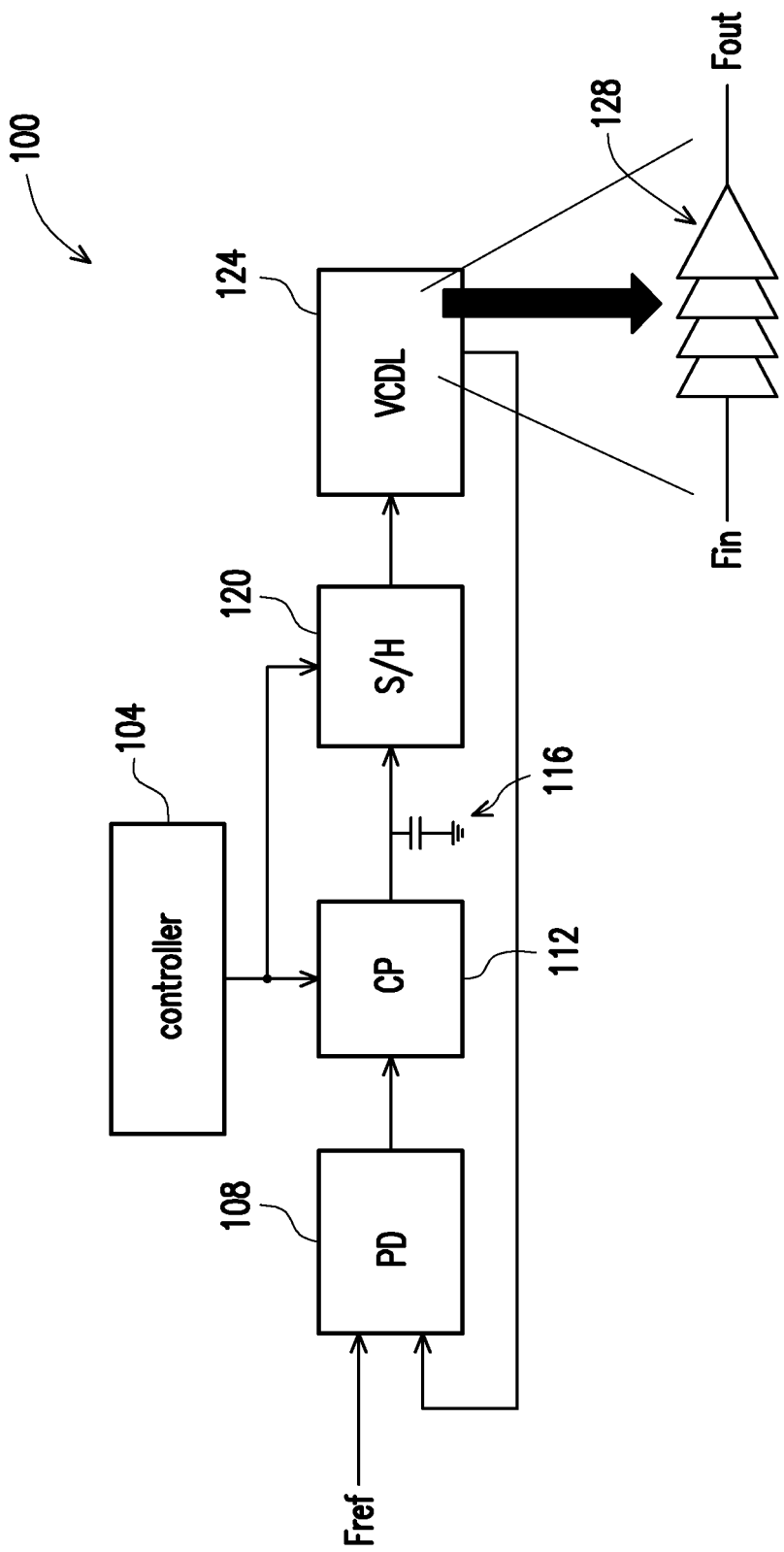
FIG. 1 depicts a pseudo delay-locked loop in accordance with examples of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As depicted in FIG. 1, a pseudo delay-locked loop (DLL) 100 including a sample and hold (S/H) portion 120 is provided in accordance with examples of the present disclosure. The pseudo delay-locked loop 100 may include a phase detector 108 which may detect a phase difference between the reference clock signal Fref and an output signal from a voltage control delay line (VCDL) 124. The phase difference may then be provided to a charge pump 112 which charges or discharges a capacitive load 116 depending upon whether the phase difference is a leading or lagging phase difference. In accordance with examples of the present disclosure, the controller 104 adjusts the current of the charge pump 112, the operating mode of the charge pump 112, and the sample and hold 120 to determine the VCDL delay time 124 for selecting an appropriate time delay 128 such that the input clock signal Fref and the output clock signal $F_{out}$ may be locked or otherwise in phase. The one or more stages of the time delay 128 may reside within the VCDL 124. In addition, four delay stages are depicted in FIG. 1; accordingly an overall VCDL delay may be computed as $\Delta T=4\Delta\theta$.

Figure 2B:
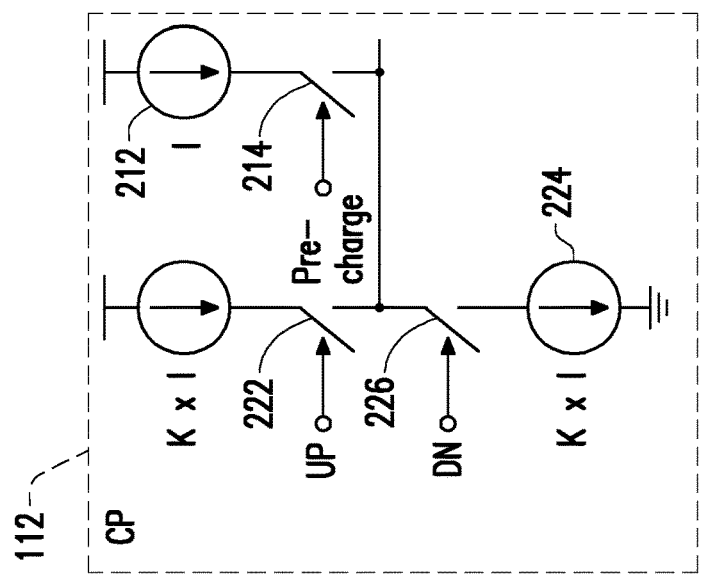
FIG. 2B depicts a block diagram of a current flow diagram in accordance with examples of the present disclosure.
Figure 2A:
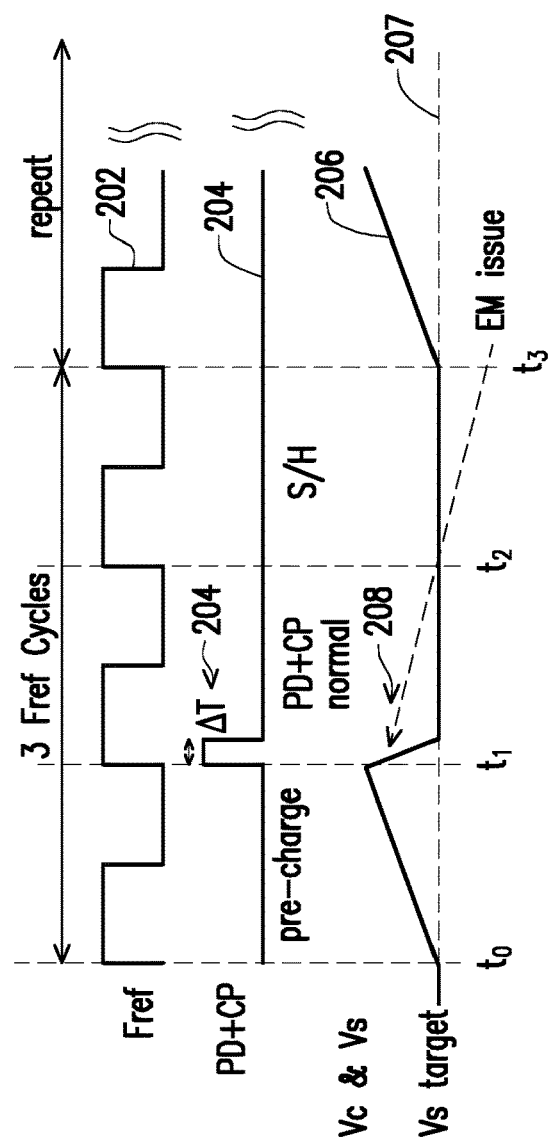
FIG. 2A depicts a block diagram of the pseudo delay-locked loop and a waveform diagram in accordance with examples of the present disclosure.

Additional details of the controller 104 along with the operation of the pseudo delay-locked loop 100 are depicted in FIGS. 2A and 2B in accordance with examples of the present disclosure. FIG. 2A illustrates a timing diagram of the input clock signal Fref 202, a detected phase error $\Delta T$ signal 204 output by the PD 108 and input to the CP 112, a voltage $V_C$ 206 of the capacitor 116, and a sampled voltage $V_S$ 207 held by the S/H circuit 120, when the controller 104 divides the operation of the pseudo delay-locked loop 100 into three operating regions: a pre-charge region, a normal region and a S/H region, in accordance with some embodiments.

FIG. 2B illustrates aspects of an example of the CP 112. During the pre-charge region, the pre-charge path of the CP 112 charges the capacitor 116 with a unit current. In some embodiments, the unit current can be approximately 10 to 100 micro amps (μA). At time t0, a first switch 214 is closed and a first current source 212 provides the pre-charge current I to charge the capacitor 116, which results in the capacitor voltage $V_C$ to increase from $t_0$ to $t_1$. In some embodiments, the pre-charge region period $(t_1-t_0)$ is the same as the input clock Fref period $T_{ref}$. Thus, during the pre-charge region, the voltage of the capacitor 116 changes in accordance with the following equation: $\Delta V_C=I/C\times T_{ref}$, where I is the magnitude of the unit current I, C is the capacitance of the capacitor 106 and Tref is the period of the input clock signal having a frequency Fref.

The pseudo delay-locked loop 100 switches to the normal operation mode from time t1 to time t2. In some embodiments, the normal operation period is the same as one reference clock Fref period $T_{ref}$. In the normal operation region, the PD 108 detects the phase skew $\Delta T$ between Fref and the VCDL 124 output and provides the $\Delta T$ to the CP 112. The CP 112 switches to normal operation mode by opening the first switch 214 and closing a switch 226 to discharge the capacitor 116 with a current K times the unit current I (K×I) through a current source 224, where K is an integer greater than or equal to 2. In response, the capacitor 116 provides a voltage $\Delta V_C$, where $\Delta V_C=-(KI/C)\times\Delta T$. Thus, $\Delta V_C$ reflects the phase delay $\Delta T$ between Fref and $F_{OUT}$.

Following the normal operation region, the pseudo DLL 100 enters the sample and hold region from time $t_2$ to $t_3$. In some embodiments, the sample and hold period is the same as one input clock Fref period $T_{ref}$. During this period, all of the switches 214, 222 and 226 are in an open state, and the S/H circuit 120 will sample the voltage value of the capacitor 166 at a predetermined time, as controlled by the controller 104, and hold the voltage value until the next sampling period at which time the next voltage value is sampled. The sampled voltage value $V_S$ is then provided to the VCDL 124, which outputs the phase difference $\Delta T$ based on the value $V_S$ and a target $V_S$ value 207. As shown in FIG. 2A, when the difference between $V_S$ and the target $V_S$ is zero (i.e., $\Delta V_{up}$ during pre-charge equals $\Delta V_{down}$ during normal discharge), the pseudo DLL 100 will be in a stable, locked state. Thus, in a locked state, $\Delta V_{up}=\Delta V_{down}$, which means $(I\times Tref)/C=(KI\times\Delta T)/C$, or $Tref=K\times\Delta T$. In some embodiments, the target $V_S$ value is equal to the value of $V_C$ at $t_0$. If the value of $V_S$ is larger than the target $V_S$ value, then the phase delay ($\Delta T$) is too small and the VCDL 124 will increase the delay. If the value of $V_S$ is smaller than the target $V_S$ value, then the phase delay ($\Delta T$) is too large and the VCDL 124 will decrease the delay. After any adjustments to the $F_{OUT}$ delay are made, the above-described pre-charge, normal mode and S/H operations are repeated.

If the VCDL 124 includes 4 delay line stages 128 such as in the example shown in FIG. 1, for example, $\Delta T=4\Delta\theta$. Since $T_{ref}=K\times\Delta T$, as discussed above, if the pump current ratio (K) is set equal to 69, it achieves a phase skew $\Delta\theta$ equal to Tref/(4×69) or Tref/276. If Tref=10 ns, then $\Delta\theta$ equals approximately 30 ps, which is an example of a target precision phase skew. However, due to the large value of K, the CP 112 consumes a large current (e.g., ~1.4 mA) in a very short time (e.g., ~144 ps), which could lead to a possible electromagnetic (EM) issues. In some embodiments, the charge consumed by the CP 112 is K times the pre-charge unit current (e.g., 69×20 μA=1.4 mA).

Figure 3:
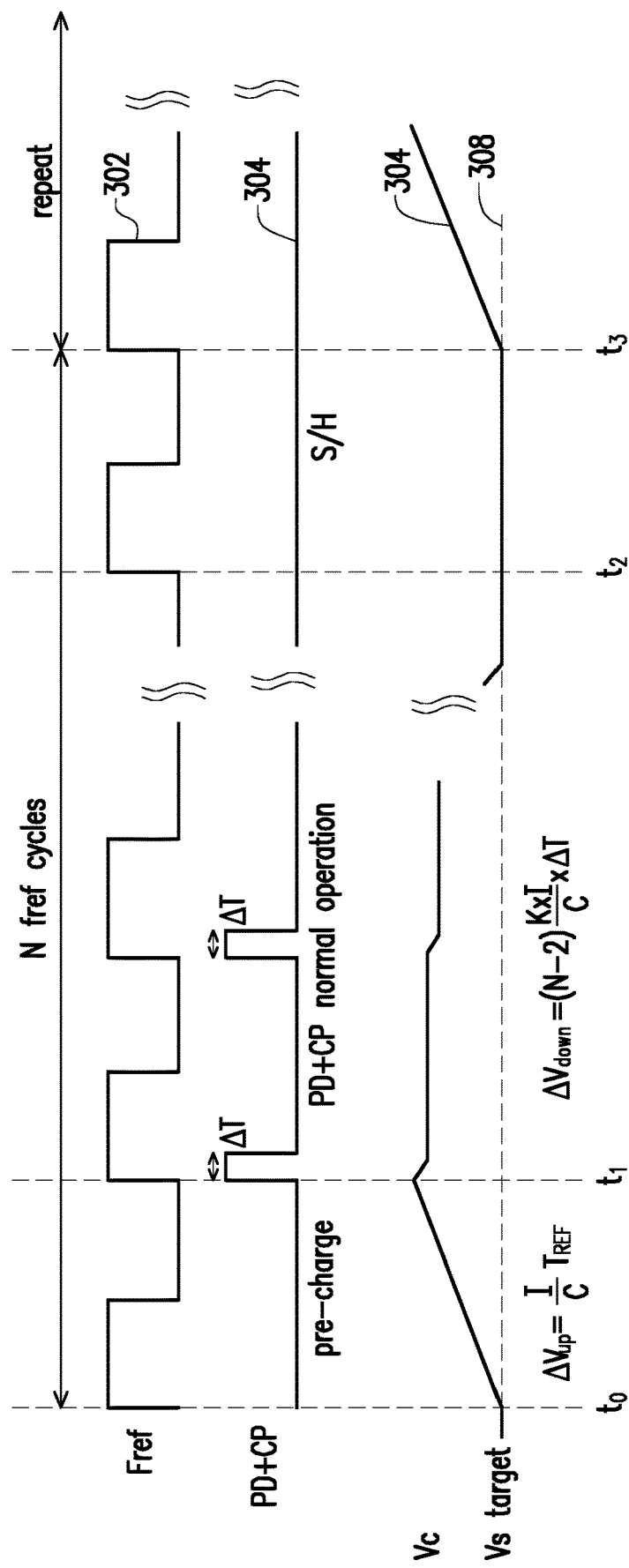
FIG. 3 depicts a waveform diagram in accordance with examples of the present disclosure.

In order to address the EM issue discussed above, in some embodiments, the controller 104 can split N Fref cycles into 3 regions, where N is an integer greater than or equal to 4, for example. FIG. 3 illustrates a timing diagram of Fref 302, $\Delta T$ 304 (as reflected by the output of PD 112 and input of CP 112), $V_C$ 306 and $V_S$ 308 when N Fref clock cycles are divided into a pre-charge region, normal operation region, and a sample and hold region, in accordance with some embodiments. The pre-charge region has a period or operation duration of one Fref clock cycle, the normal operation region has a period of N−2 clock cycles, and the S/H region has a period of one clock cycle. In other words, the normal operation period ($t_2-t_1$) is N−2 clock cycles long. Thus, during normal operation, the CP 112 will discharge the capacitor 106 with K times the unit current I (i.e., K×I) over a period of N−2 clock cycles of Fref (i.e., (N−2)×Tref).

Figure 4:
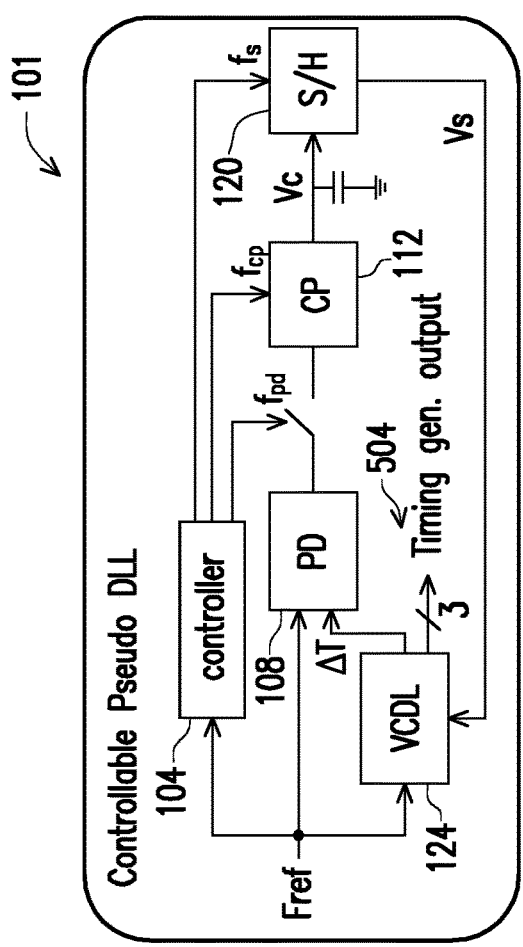
FIG. 4 depicts a controllable pseudo delay-locked loop having a timing output pickoff in accordance with examples of the present disclosure.

As shown in FIG. 3, in the normal operation region, $\Delta V_C$ is equal to [(N−2)KI/C]×$\Delta T$. If the VCDL 124 includes 4 delay line stages (i.e., $\Delta T$=440), and the pump current ratio (K) is set equal to 3, and N is set equal to 25, for example, a phase skew 40 equal to Tref/276 may be achieved, which is one exemplary design target. However, in this embodiment, the current KI can be discharged over a much larger time period and thus the amount of current discharged over a single clock cycle can be reduced by a factor of N−2. If N=25, for example, the current is reduced by a factor of 23 times, which significantly alleviates or solves the EM issues discussed above. Referring again to FIG. 1, the value of N can be set by a user via an input to the controller 104. Based on this input, the controller 104 will set the number of clock cycles for the normal operating region to N−2 cycles, in accordance with some embodiments Some disclosed examples address measuring the slope of the delay time ($\Delta T$), $K_{VCDL}$. Another example controllable pseudo DLL 101 is depicted in FIG. 4, in which a timing generation output 504 may be provided as an output for subsequent measurement. That is, the VCDL 124 may be duplicated or tapped from the pseudo DLL 101 and may be provided to a measurement mechanism. The pseudo DLL 101 may be similar to the pseudo DLL 100 shown in FIG. 1, for example, and as such includes the S/H 120, the PD 108, the CP 112, the controller 104, capacitor 116 and the VCDL 124 with time delay stages 128.

Figure 5:
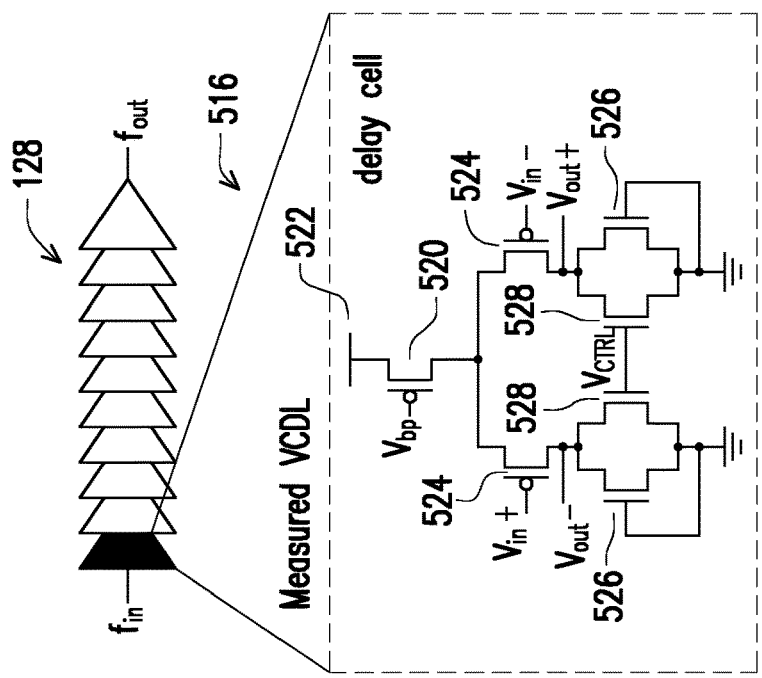
FIG. 5 depicts additional details of delay timing stages in accordance with examples of the present disclosure.

FIG. 5 illustrates a typical delay cell 516 from a plurality of delay stages 128 of the VCDL 124. The delay cell includes differential input signals Vin+, Vin− and provides differential output signals Vout+,Vout−. The CP 112 voltage Vbp is received at the gate terminal of a PMOS transistor 520 that is connected to a voltage supply terminal 522.

The delay cell 516 includes two legs connected between the PMOS transistor 520 and ground implementing a variable load. The Vin+ and Vin− signals are received at gate terminals of PMOS transistors 524 of respective legs of the delay cell 516. Each leg further includes parallel-connected NMOS load transistors 526, 528. The Vout−,Vout+ signals are provided at nodes between the PMOS transistors 524 and the parallel-connected NMOS transistors 526,528. The $V_{CTRL}$ signal is received at the gate terminals of the NMOS transistors 528.

In general, $V_{CTRL}$ varies in the pseudo DLL 101 closed loop and is provided as a tuning input to the VCDL 124 to adjust delay time of the VCDL 124. $V_{CTRL}$ further changes with the CP 112 charge/discharge current and period. The varying $V_{CTRL}$ changes effective resistance of the delay cell 516 to change the total delay. The operation of the delay cell 516 is discussed further in conjunction with FIG. 8A below.

Figures 6A, 6B:
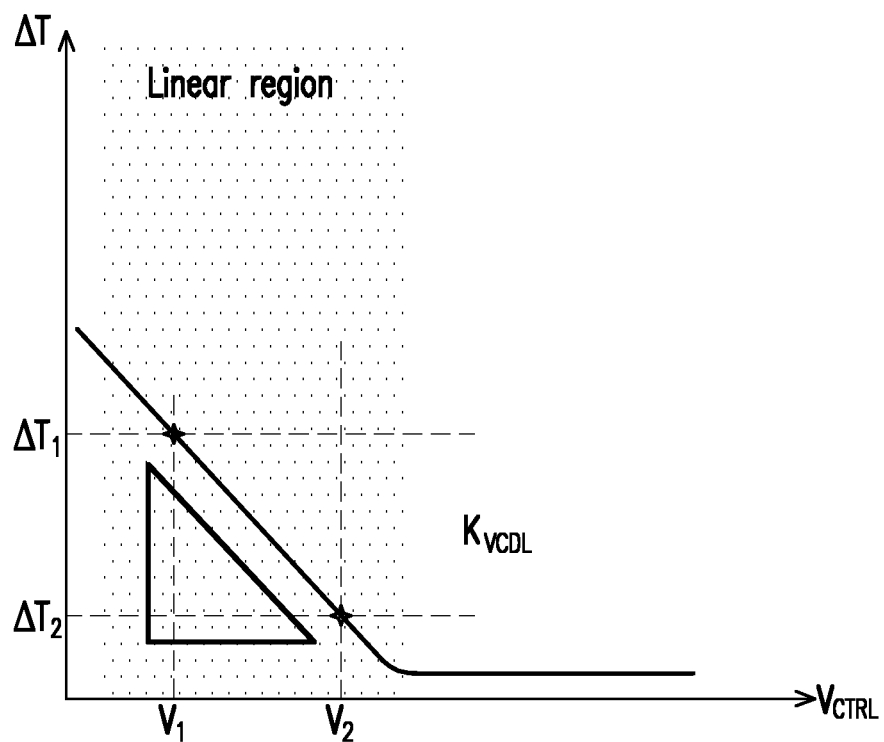
FIG. 6A depicts additional details related to obtaining a $K_{VCDL}$ measurement in accordance with examples of the present disclosure.
FIG. 6B depicts an example calibration graph in accordance with examples of the present disclosure.

As depicted in FIG. 6A, to measure $K_{VCDL}$, initially, both $N_1$ and $K_1$ may be specified and a resulting $\Delta T_1$ may be obtained together with a measured voltage of where $V_1$ is a measure of VCDL. A different $N_2$ and $K_2$ may be specified to obtain $\Delta T_2$ and $Vs_2$. Utilizing these two points as coordinates, a line between these two coordinates represents the target $K_{VCDL}$ as depicted in FIGS. 6A and 6B. That is, $$K_{VCDL} = \frac{\Delta T_2 - \Delta T_1}{V_2 - V_1}.$$

Since $\Delta T$ is known, a measure of a known quantity, such as 100 mV of $\Delta V$ may be acquired instead of a small $\Delta T$ measurement to obtain $K_{VCDL}$.

Figure 7:
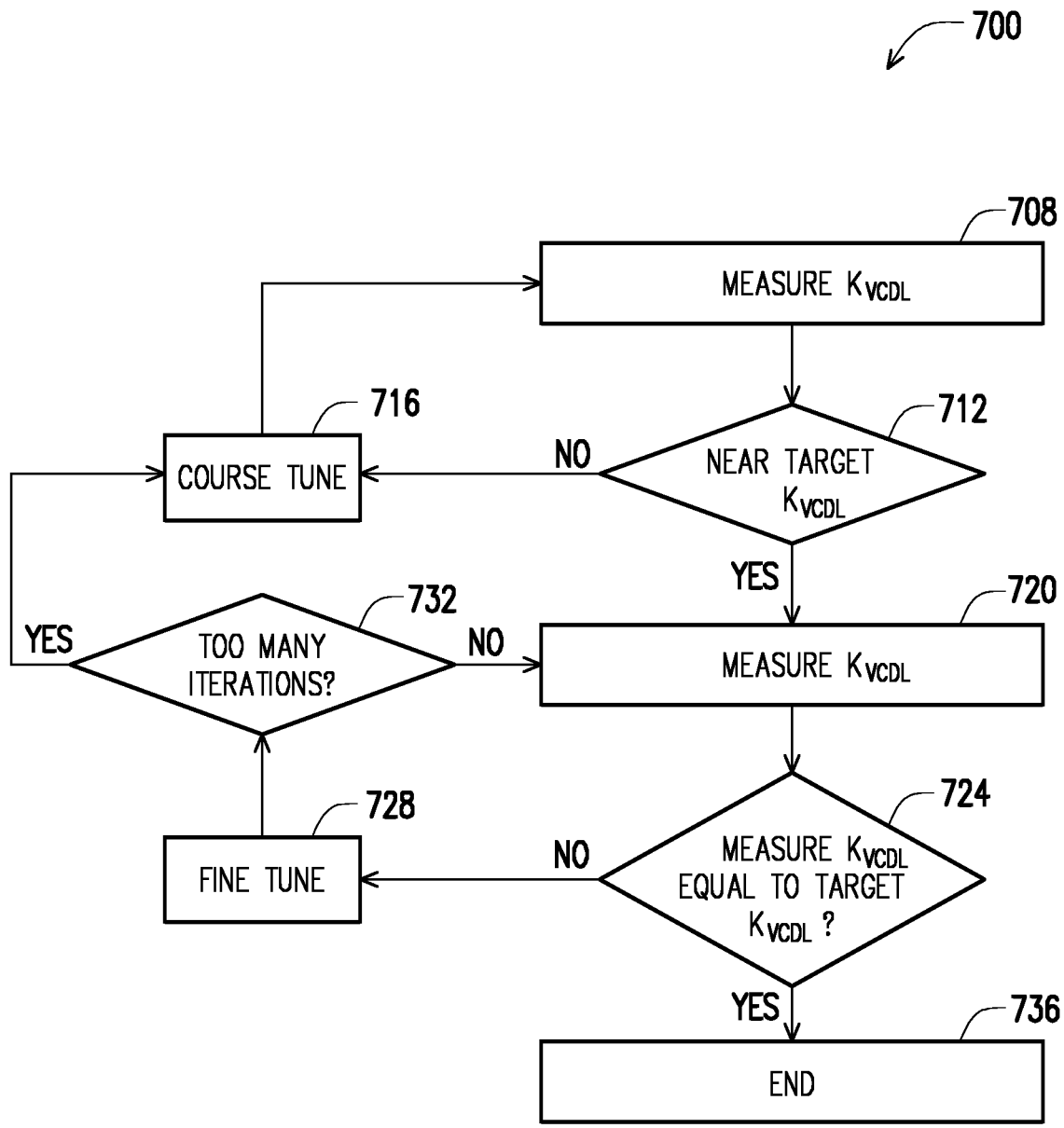
FIG. 7 depicts a flow diagram of a process for finding and calibrating $K_{VCDL}$ in accordance with examples of the present disclosure.

Further, based on a measurement of $K_{VCDL}$, a $K_{VCDL}$ calibration method may be performed. For example, and as depicted in FIG. 7, a method of obtaining and calibrating $K_{VCDL}$ may be performed as a method 700. That is, in a step 708 a measurement of $K_{VCDL}$ may be obtained as discussed above. If the derived value of $K_{VCDL}$ appears to be far from a target $K_{VCDL}$, (e.g., a large difference between $K_{VCDL}$ and the target $K_{VCDL}$ exists) as determined at step 712, the delay cell, such as delay cell 516, may be initially coarse tuned at step 716 to adjust a delay time. An example coarse tuning may occur as further described below with respect to FIGS. 8A, 8C, and 9A-9C. Once $K_{VCDL}$ is measured at step 720 for example, and determined not equal the target $K_{VCDL}$ at step 724, a fine tuning of the delay cell, such as the delay cell 516, is performed at step 728 until the measured $K_{VCDL}$ equals or essentially is equal to the target $K_{VCDL}$ at step 724. An example of fine tuning may occur as further described below with respect to FIGS. 8A, 8B, and 10A-10C. In some instances, a coarse tuning of the delay cell, such as the delay cell 516, may need to be performed multiple times if the target $K_{VCDL}$ is initially unattainable, for example if there are too many iterations at step 732. Once the measured $K_{VCDL}$ equals or essentially is equal to the target $K_{VCDL}$ at step 724, the method 700 may end at 736.

Figure 8A:
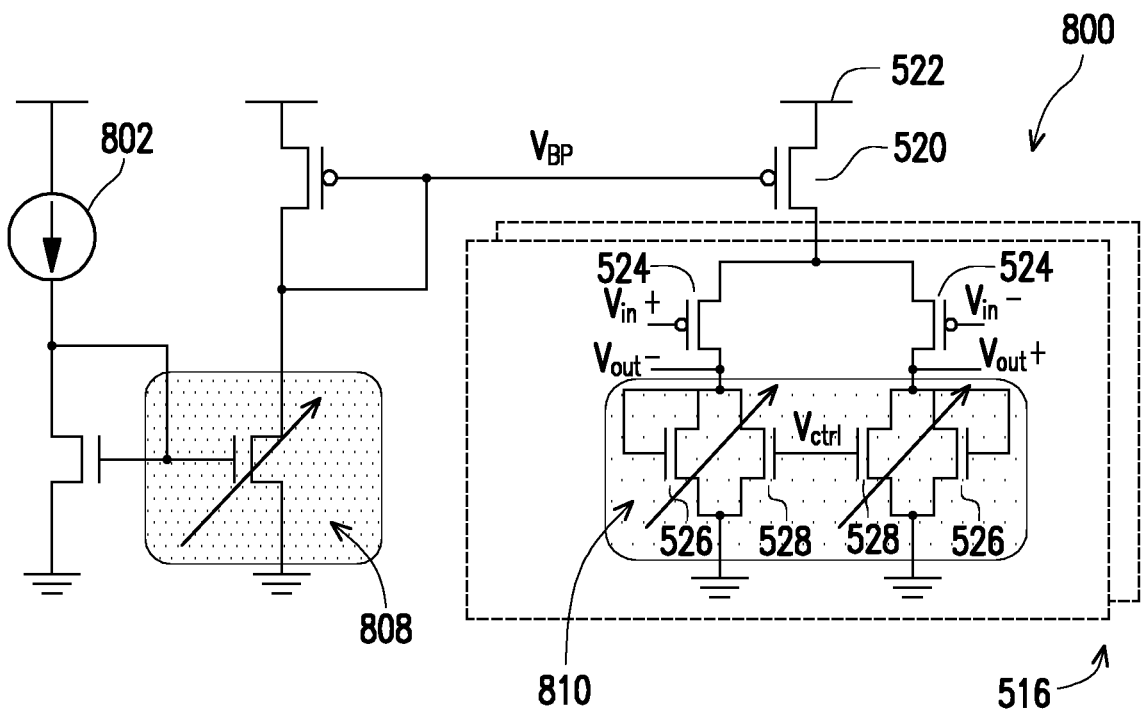
FIG. 8A depicts example calibration adjustments in accordance with examples of the present disclosure.
Figure 8B:
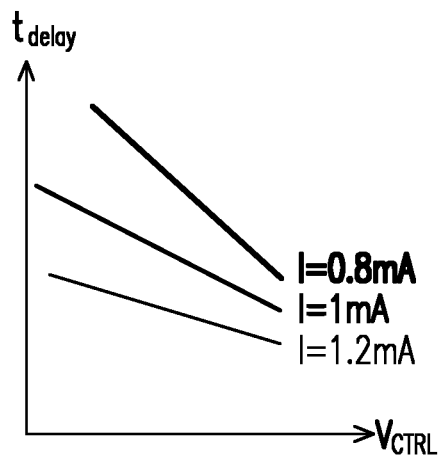
FIG. 8B depicts an example graph illustrating a fine tune adjustment process to adjust current in accordance with examples of the present disclosure.

In accordance with examples of the present disclosure, the coarse tuning process and the fine tuning process may be implemented utilizing a tuning circuit 800 depicted in FIG. 8A. The tuning circuit 800 includes a plurality of the delay cells 516 shown in FIG. 5. The tuning circuit 800 includes a current source 802 which is controllable via a tuning transistor 808. The current from the current source 802 may be varied by varying the number of tuning transistors 808. For example, the current may be increased by connecting additional tuning transistors 808 in parallel with one another. Further, the delay cells 516 include a variable load 810 comprising a plurality of the load transistors 526, 528. The coarse tuning process shown in step 716 of FIG. 7 may be implemented by varying the number of load transistors 526, 528 of the load 810. For instance, the load decreases as additional transistors are connected in parallel.

Figure 8C:
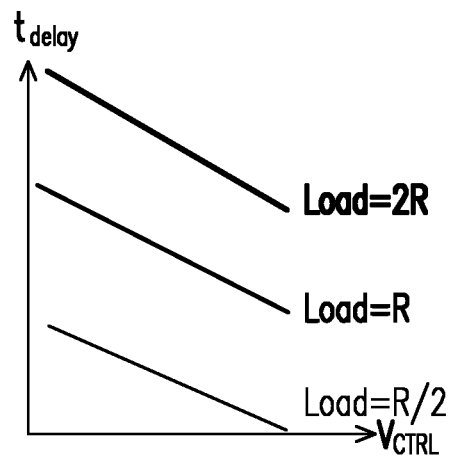
FIG. 8C depicts an example graph illustrating a coarse tune adjustment process to adjust a load in accordance with examples of the present disclosure.

A range of the delay time may be varied as a change in the load is varied, as depicted in FIG. 8C. However, $K_{VCDL}$ is maintained substantially constant while performing the tuning process, as the slope of $K_{VCDL}$ is substantially unchanged.

FIGS. 9A-9C further illustrate how $K_{VCDL}$ stays substantially constant while the load is adjusted in accordance with some examples. That is, adjusting the load varies the delay time range $T_{delay(s)}$. The load may be adjusted by adding or adjusting resistance elements at the load 810 (i.e. load transistors 526, 528); in some examples, an additional transistor may be added, a characteristic of the transistor of the load 810 may be adjusted, and/or another resistive element may be added or changed. As further depicted in FIGS. 9A-9B, a first load corresponding to R may cause the $K_{VCDL}$ to be equal to the slope 904A while a second load correspond to R/2 may cause the $K_{VCDL}$ to be equal to the slope of 904B. As depicted in FIGS. 9A-9C, $K_{VCDL}$ may be obtained utilizing voltage $V_1$ and $V_2$ together with the corresponding time delays $t_1$ and $t_2$. Although the load has changed, the $K_{VCDL}$ measurement remains substantially the same.

The fine tuning process, such as the fine tuning process of step 728 of FIG. 7, may be implemented by adjusting an amount of current that is coupled to the delay cell 516. For example, when adjusting the current, the $K_{VCDL}$ will also change as additionally depicted in FIG. 8B. More specifically, $K_{VCDL}$ decreases as the current increases. FIGS. 10A-10C further illustrate how $K_{VCDL}$ changes with a current adjustment. That is, increasing the current results in a decreased $K_{VCDL}$ while decreasing the current would result in an increased $K_{VCDL}$. For example, a first current I=0.8 mA may result in a first measured $K_{VCDL}$ to be equal to the slope 1004A. If current is increased to a second current I=1.0 mA for example, a second measured $K_{VCDL}$ may be equal to the slope 1004B. If current is further increased again to a third current I=1.2 mA for example, a third measured $K_{VCDL}$ may be equal to the slope 1004C. As depicted in FIGS. 10A-10C, $K_{VCDL}$ may be obtained utilizing voltage $V_1$ and $V_2$ together with the corresponding time delays $t_1$ and $t_2$. Accordingly, by adjusting the current, the $K_{VCDL}$ may be finely tuned to a desired $K_{VCDL}$. The load may be adjusted by adding or adjusting resistance elements at the load 808; in some examples, an additional transistor(s) may be added, a characteristic of the transistor of the load 808 may be adjusted, and/or another resistive element may be added or changed.

Thus, in accordance with examples of the present disclosure, a $K_{VCDL}$ measurement and calibration mechanism and process is provided. That is, by measuring ΔV rather than ΔT, a less complex manner of obtaining $K_{VCDL}$ is provided utilizing minimal additional circuitry. Accordingly, the VCDL in the pseudo DLL may be utilized for precision timing generation such that new or specialized measurement apparatuses are not needed or necessary. Moreover, the closed loop characteristics in the pseudo DLL creates a relationship between a control voltage and a ΔT such that it is independent of PVT variation.

In accordance with at example of the present disclosure, a delay-locked loop is provided. The delay-locked loop may include a phase detector configured to detect a phase difference between a first clock and a second clock, a charge pump configured to increase a charge amount at a capacitive load in accordance with a first charge amount and decrease the charge amount at the capacitive load in accordance with a second charge amount based on a phase difference provided by the phase detector, a sample and hold circuit configured to receive the charge amount from the capacitive load and hold the charge amount, and a voltage control delay line configured to select a delay amount based on the charge amount received from the sample and hold circuit, where at least one parameter of the delay locked loop is configured such that a desired pump current ratio of a delay cell is achieved by adjusting a delay amount of the delay cell and/or an amount of current coupled to the delay cell.

In accordance with another example of the present disclosure, a method of configuring a pump current ratio of a delay cell is provided. The method may include obtaining a first pump current ratio measurement from a delay cell, adjusting a delay time of the delay cell to yield a second pump current ratio measurement, and adjusting an amount of current coupled to the delay cell to yield a third pump current ratio measurement, wherein the third pump current ratio measurement is substantially equal to a pump current ratio design target.

In accordance with at example of the present disclosure, a delay-locked loop is provided. The delay-locked loop may include a phase detector configured to detect a phase difference between a first clock and a second clock, a charge pump configured to increase a charge amount at a capacitive load in accordance with a first charge amount and decrease the charge amount at the capacitive load in accordance with a second charge amount based on a phase difference provided by the phase detector, a sample and hold circuit configured to receive the charge amount from the capacitive load and hold the charge amount, a plurality of delay cells, and a voltage control delay line configured to select a delay cell of the plurality of delay cells based on the charge amount received from the sample and hold circuit, where a pump current ratio of the delay cell is based on a load coupled to the delay cell and a current coupled to the delay cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A delay-locked loop comprising:
a phase detector configured to detect a phase difference between a first clock and a second clock;
a charge pump configured to increase a charge amount at a capacitive load in accordance with a first charge amount and decrease the charge amount at the capacitive load in accordance with a second charge amount based on a phase difference provided by the phase detector;
a sample and hold circuit configured to receive the charge amount from the capacitive load and hold the charge amount; and
a voltage control delay line (VCDL) configured to select a delay amount based on the charge amount received from the sample and hold circuit, the VCDL comprising:
a plurality of delay stages, each delay stage comprising:
a delay cell, the delay cell comprising a tuning circuit, the tuning circuit comprising:
a tuning transistor to control a current source, wherein at least one parameter of the delay-locked loop is configured such that a desired pump current ratio of a delay cell is achieved by adjusting a delay amount of the delay cell and/or by the tuning transistor adjusting a current from the current source to adjust an amount of current coupled to the delay cell.

2. The delay-locked loop according to claim 1, wherein the delay amount of the delay cell is adjusted by increasing or decreasing a load coupled to the delay cell.

3. The delay-locked loop according to claim 2, wherein the load coupled to the delay cell includes at least one transistor, and wherein the load is increased or decreased by varying one or more parameters of the at least one transistor.

4. The delay-locked loop according to claim 2, wherein the load coupled to the cell includes at least one transistor, and wherein the load is increased or decreased by adding or subtracting another transistor.

5. The delay-locked loop according to claim 2, wherein the delay amount of the delay cell is adjusted after the amount of current coupled to the delay cell is adjusted.

6. The delay-locked loop according to claim 1, further comprising a controller configured to adjust an amount of the second charge amount based on a first number of reference cycles.

7. The delay-locked loop according to claim 1, wherein the charge pump provides the first charge amount to the capacitive load in a first clock cycle, the sample and hold circuit acquires a sample of the charge amount at the capacitive load at a last clock cycle, and the charge pump provides a plurality of charge amounts to decrease the charge amount at the capacitive load in accordance with a plurality of clock cycles between the first clock cycle and the last clock cycle.

8. The delay-locked loop according to claim 7, wherein after the last clock cycle, the charge pump again provides the first charge amount to the capacitive load.

9. The delay-locked loop according to claim 1, wherein the voltage control delay line is configured to select a delay amount from the plurality of delay stages based on the charge amount received from the sample and hold circuit.

10. The delay-locked loop according to claim 9, wherein the plurality of delay stages includes no more than four delay stages.

11. The delay-locked loop according to claim 1, wherein the first charge amount is equal to $$\frac{I}{C} \times T_{REF},$$

where I is equal to current, C is equal to charge, and $T_{REF}$ is equal to a clock period of a reference clock.

12. The delay-locked loop according to claim 7, wherein $T_{REF}$ is equal to a clock period of the second clock cycle.

13. A method of configuring a pump current ratio of a delay cell, the method comprising:
obtaining a first pump current ratio measurement from a delay cell;
adjusting a delay time of the delay cell by increasing or decreasing a load coupled to the delay cell to yield a second pump current ratio measurement; and
adjusting an amount of current coupled to the delay cell to yield a third pump current ratio measurement, wherein the third pump current measurement is substantially equal to a pump current ratio design target.

14. The method of claim 13, wherein the amount of current coupled to the delay cell is adjusted by a tuning transistor coupled to the delay cell and a current source.

15. The method of claim 14, wherein the load coupled to the delay cell includes at least one transistor, and wherein the load is increased or decreased by varying one or more parameters of the at least one transistor.

16. The method of claim 14, further comprising:
adjusting the delay time of the delay cell to yield another pump current ratio measurement after adjusting the amount of current coupled to the delay cell.

17. The method of claim 16, further comprising:
adjusting an amount of current coupled to the delay cell a second time.

18. A delay-locked loop comprising:
a phase detector configured to detect a phase difference between a first clock and a second clock;
a charge pump configured to increase a charge amount at a capacitive load in accordance with a first charge amount and decrease the charge amount at the capacitive load in accordance with a second charge amount based on a phase difference provided by the phase detector;
a sample and hold circuit configured to receive the charge amount from the capacitive load and hold the charge amount;
a plurality of delay cells, the delay cell comprising a tuning transistor to control a current source; and
a voltage control delay line (VCDL) configured to select a delay cell of the plurality of delay cells based on the charge amount received from the sample and hold circuit,
wherein a pump current ratio of the delay cell is based on a load coupled to the delay cell and a current coupled to the delay cell controlled by the tuning transistor.

19. The delay-locked loop according to claim 18, wherein the load coupled to the delay cell includes at least one transistor, and wherein the load is increased or decreased by varying one or more parameters of the at least one transistor or by adding or subtracting another transistor.

20. The delay-locked loop according to claim 19, wherein an amount of current coupled to the delay cell is based on the load coupled to the delay cell.

* * * * *